United States Patent [19]

De Roo

[11] Patent Number: 4,523,190
[45] Date of Patent: Jun. 11, 1985

[54] LOCAL EXCHANGE EQUIPMENT FOR A CABLE NETWORK

[75] Inventor: Minno De Roo, Delft, Netherlands

[73] Assignee: Deltakabel B.V., Netherlands

[21] Appl. No.: 402,280

[22] Filed: Jul. 27, 1982

[30] Foreign Application Priority Data

Apr. 29, 1982 [EP] European Pat. Off. ........ 82200516.1

[51] Int. Cl.³ .................. H04Q 9/00; H04N 7/16
[52] U.S. Cl. .................. 340/825.03; 358/86; 370/73; 455/209; 455/315
[58] Field of Search ............ 340/825.03; 455/3, 179, 455/209, 187, 4, 209, 146, 315; 358/86; 370/57, 69.1, 120, 73, 71

[56] References Cited

U.S. PATENT DOCUMENTS

| 4,135,157 | 1/1979 | den Toonder | 358/86 |
| 4,302,771 | 11/1981 | Gargini | 358/86 |
| 4,313,212 | 1/1982 | Whitlock | 455/315 |
| 4,398,286 | 8/1983 | Geesen et al. | 370/69.1 |
| 4,400,726 | 8/1983 | Van Hulle | 455/3 |
| 4,484,218 | 11/1984 | Boland et al. | 358/86 |

FOREIGN PATENT DOCUMENTS 2851906  6/1979  Fed. Rep. of Germany .
1412586  11/1975  United Kingdom .

Primary Examiner—Donald J. Yusko
Attorney, Agent, or Firm—Parmelee, Bollinger, Bramblett & Drumm

[57] ABSTRACT

Switching system for transmitting program or data signals from an exchange to a number of subscriber posts, in which the processing of selection signals received by the exchange from the subscriber posts, the tuning of oscillators in the exchange, and the eventual correction of a drifting oscillator are carried out in separate control loops. In a first control loop, the subscriber posts are scanned for selection signals at a high scanning rate. In a second control loop, oscillators which must be tuned to a frequency corresponding to a received selection signal, are scanned and properly tuned within a scanning period. In a third control loop, all oscillators are scanned sequentially and a correction signal is provided if frequency drift has occurred in any oscillator.

24 Claims, 2 Drawing Figures

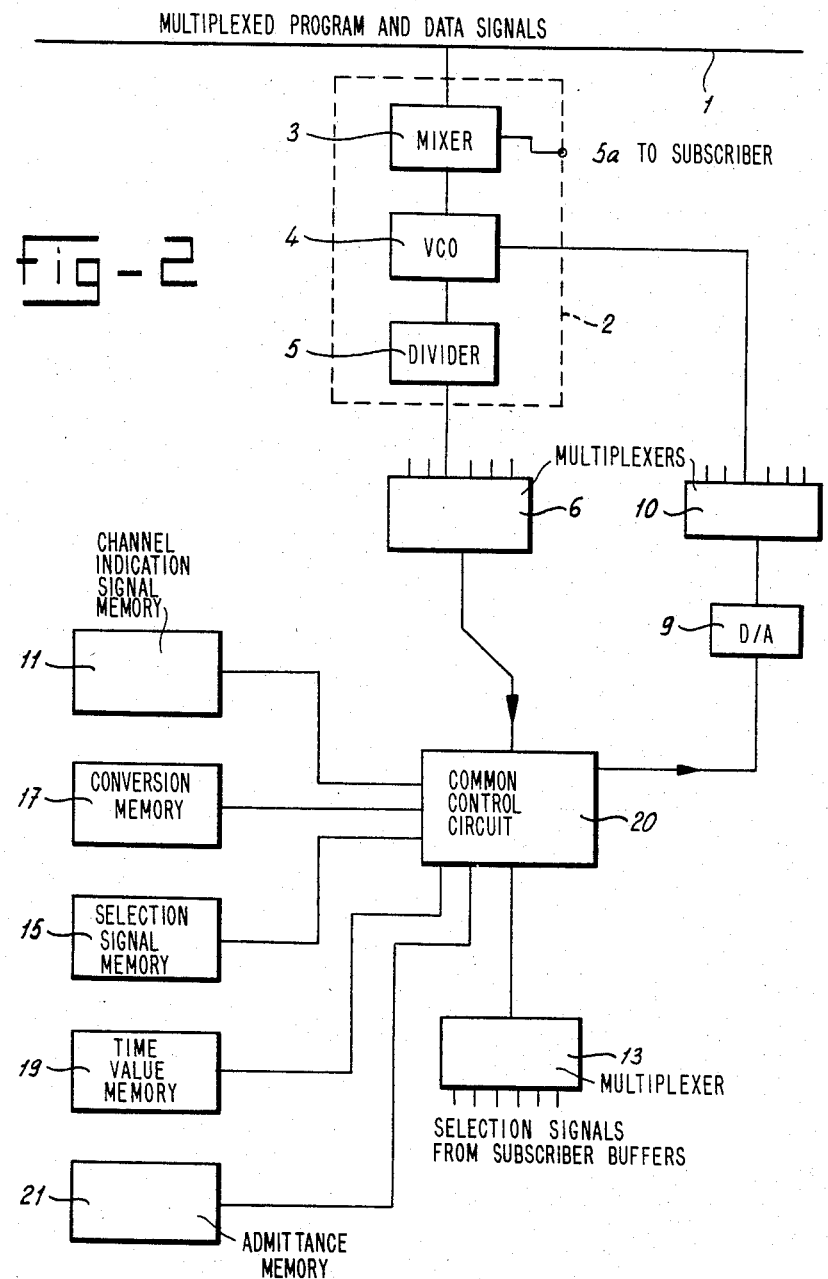

LOCAL EXCHANGE EQUIPMENT FOR A CABLE NETWORK

FIELD OF THE INVENTION

The invention relates to a switching system comprising an exchange and a number of subscriber posts connected to said exchange through a cable network, whereby each subscriber post comprises selector means for generating selection signals for selecting one out of a number of program or data signals accomodated into channels received in the exchange over a multiplex line, and said exchange furthermore comprises for each subscriber post a mixing stage and a corresponding voltage controlled oscillator with a voltage memory, and furthermore comprises means for scanning the selection signals of the subscriber posts by means of a multiplexer, means for deriving a frequency signal, related to the nominal oscillator frequency, out of each selection signal, means for deriving a signal from the oscillator assigned to the corresponding subscribing post through a multiplexer and means for comparing said derived oscillator signal with said frequency signal related to the nominal oscillator frequency to generate a control signal for the voltage memory assigned to the measured oscillator which control signal is delivered thereto through a multiplexer for adjusting the oscillator such, that the program- or data signals chosen by means of the selection signals are transmitted from the exchange through the mixing stage and the cable network to the corresponding subscriber.

BACKGROUND OF THE INVENTION

The switching system of the above mentioned type, especially destined to transmit television signals received in a number of channels on a multiplex line to subscriber posts, is known from the Dutch Patent Application No. 7803048 (corresponding to U.S. Pat. No. 4,135,157). In said known switching system a number of multiplexers are used on the one hand for sequentially scanning the voltage controlled oscillators corresponding to said mixing stages and on the other hand to receive selection signals from the subscriber posts. Through each of the subscriber terminals of this exchange a digital selection signal is received representative for the channel selected by the subscriber post concerned. On the basis of this digital selection signal an impulse series is generated in the exchange of which the frequency is representative for the desired nominal oscillator frequency of the mixing stage oscillator. Said impulse series is compared with an impuls series derived from the oscillator concerned and if a difference is detected the oscillator will be adjusted. This is done when a new channel is selected by the subscriber, in which case the related mixing stage oscillator has to be detuned over a relatively large frequency distance, as well as when still the same channel should be received and the oscillator is only drifting from the nominal frequency for instance under the influence of temperature variations.

All subscriber terminals are cyclically scanned and the signal received from each subscriber terminal is processed in the above described way. That implies that during each scanning selection information has to be received from the subscriber terminal, also in case the subscriber has not put in new selection information in which case in the exchange in fact the same selection information as in the preceding scanning is processed. The selection signals generated by a subscriber post must be stored in this known system in such a way that they are available during each scanning.

If between the generation of a selection signal in the subscriber post and the reception of the television signal corresponding with this selection signal a relatively long time period passes, for instance more than a few seconds, then the subscriber will find this very inconvenient. To avoid this inconvenience each subscriber has to be scanned for instance once per second to be able to react within a reasonable short time onto the selection of another channel by the subscriber. During the cyclical scanning of all the subscriber terminals connected to the exchange there is therefore only a relatively short time period available for such subscriber terminal in which time period eventually the oscillator has to be adjusted or, in case another channel is selected, has to be detuned over a smaller or larger distance. As is indicated in said Dutch Patent Application No. 7803048 (corresponding to U.S. Pat. No. 4,135,157) it is possible that, dependent on the frequency difference between the selected channel and the real oscillator frequency, more than one scanning is necessary before the oscillator will reach the correct frequency corresponding to the selected channel. In that case during each scanning the oscillator is detuned over a little distance in the desired direction. That means, however, that, in case each subscriber is for instance scanned once per second and for instance six scannings are necessary to detune the oscillator assigned to the subscriber concerned to the desired frequency, approximately six seconds will pass before the subscriber receives the desired channel as a result of his generated selection signal. Furthermore this subscriber will during this detuning period receive all kinds of undesired signals because the oscillator is each time detuned over a part of the detuning distance and stops thereafter on a momentaneous value, is detuned further and stops again, etc. Because this time delay is, dependent on the distance over which the oscillator has to be detuned, not equal in all cases, the subscriber not only will find this very annoying but is furthermore tending quickly to think that something is not functioning properly. If one likes to restrict this phenomenon in the known system then per scanning a certain minimum time period should be available to detune the oscillator, which time period should be selected so long that, in each case the desired tuning of the oscillator is reached within a very restricted number of scannings. Preferably the whole system should be dimensioned such, that the oscillator can be detuned to each desired frequency into one cycle. That means, however, that the number of subscribers, which can be connected to such a known exchange is rather restricted.

As long as no new selection signal is generated by a subscriber in fact during each scanning the same selection signal as during the preceding scanning is received from this subscriber post and the corresponding frequency signal is compared with the signal derived from the real oscillator frequency. If the oscillators are accommodated into an outdoor housing in the neighbourhood of the houses into which the corresponding subscriber posts are present, which is the case in the known system, then said oscillators have to function under very diverging temperatures. It is not imaginary that in the summer in the full sun the temperature inside the housing will climb until 60° à 70° C. whereas in winter one has to reckon with temperatures of −15° C. and −20° C., dependent onto the local climatological circumstances. Because of these temperature influences the frequencies generated by said oscillators under the same nominal control voltage can vary very strongly, which may lead to a strong disturbance or even the total disappearing of the selected channel. Because of this reason the frequencies generated by the oscillators in said known system are periodically compared with the nominal frequencies, also in case the selection signal is not changed in relation to the preceding scanning. If the generated oscillator frequency is drifting away then an adjustment is possible during each scanning.

As is already explained above a certain minimum time period should be maintained for scanning each subscriber's post to be able to detune the related oscillator within an acceptable time period if the selection signal is changed. Because on the other hand the oscillators will drift relatively slow under the influence of temperature and other influences and especially the drift between two scannings will be very small, only a relatively small time period is necessary to adjust an oscillator if necessary. Because during the major part of these scannings the selection signal will not be changed and therefore during most of the scannings the oscillator only has to be corrected eventually if the oscillator is drifted over a small distance, for which relatively little time is necessary, indeed significantly less time than the above mentioned minimum time period, during each scanning cycle in this known system relatively much time is lost. In fact this known exchange is based on a compromise between a long detuning period, a short correction period and a minimum number of subscriber posts connectable to the exchange.

A further disadvantage is that during each scanning a signal related to the oscillator frequency is compared with an impuls series which in one way or another is generated on the basis of the selection signal received from the momentaneous scanned subscriber. That implies that in said known system an impulse oscillator has to be used which, during the scanning of each next subscriber post should be able to generate another frequency. If only one variable impulse oscillator is used then one has to take into account the transition phenomena when switching to a next subscriber post, so that the time necessary for scanning a subscriber post is extended. If a number of fixed impulse generators are used, one for each possible to select channel, then this large number of oscillators itself is a disadvantage and for the more switching means have to be used to couple one of these oscillators with the frequency comparison means. In all cases these oscillators should be extremely stable and not or hardly temperature-sensitive, because otherwise the signal related to the mixing stage oscillator frequency is compared with an impuls series which is itself insecure or instable, so that the whole checking procedure of the mixing stage oscillators overshoots his mark. This requirement, however, leads to a significant increase in the cost for these oscillators.

Apparently the frequency comparison means in this known system are embodied as a forward/backward-counter, of which the forward input for instance receives the nominal impuls oscillator signal derived from the selection signal and of which the backward input received the signal derived from the mixing stage oscillator or vice versa. If the frequencies of the signals are exactly equal then the counter will receive the same number of forward counting pulses as backward counting pulses and will therefore theoretically at the end of the comparison period be in the starting position, for instance in the zero position. However, that is not always true. It has appeared that very easily a swinging around the zero position will develop. If the counter at the end of the comparison period for instance ends with a content of one, then a control signal will be generated to correct said mixing stage oscillator. Although this will be a very small correction signal, the result of this correction signal can very easily be that in the next scanning the counter not ends in the zero position but with a content of −1, which causes an oppositely directed correction signal, etc. The result thereof is that the mixing stage oscillator will be frequency modulated in a low frequency rhythm related to the scanning frequency. In case of television signals this causes a very annoying picture disturbance which is certainly unwanted in cable television systems.

There is a further way to influence the oscillator frequency in this known system. In the control line of the voltage memory assigned to each of said oscillators a switch is inserted which is closed as long as the subscriber selects channels which he is allowed to receive. If, however, the subscriber generates a selection signal for receiving a channel for which he has no admittance, then this will be detected in the exchange by means of a separate unit and said unit now delivers a switch control signal for opening the switch assigned to this subscriber. The result thereof will be on the one hand that the subscriber is not receiving the selected channel, for which he has no reception allowance, because the oscillator does not receive a control signal and is therefore not detuned to this "forbidden" channel. However, the oscillator stays in principle tuned to the channel, which was received before and this tuning will not be changed as long as the subscriber does not generate a new selection signal for a channel, which he is allowed to receive. On the other hand, however, the switch will stay open, so that the oscillator signal is able to drift and therefore the reception of the channel, which is still transmitted, will deteriorate. Because of the open switch this drift of the mixing stage oscillator is not corrected. If the subscriber after selecting the channel, the reception of which is not allowed, does not do anything at all, then even the situation will appear that the voltage of the voltage memory assigned to this oscillator will decrease very slowly, so that the oscillator very slowly is detuned and the subscriber therefore will receive slowly various channels during a shorter or longer time period, amongst other channels for the reception of which he has in fact no admittance. This very unwanted situation is only ended when the subscriber selects a new allowed channel.

SUMMARY OF THE INVENTION

An object of the invention is now to provide a system which does not have the above-mentioned disadvantages, at least to a significantly minor degree.

Said object is according to the invention reached with a switching system of the above mentioned type in that each of the subscriber posts comprises a buffer memory for storing selection signals and the exchange comprises means for distinguishing a new selection signal from an unaltered selection signal, a selection signal memory in which the new selection signals received from the buffer memories in the subscriber posts are stored, a conversion memory for deriving a digital channel indication signal out of a selection signal from the selection signal memory, a digital to analogue converter for converting said digital channel indication signal into a control signal for the related voltage memory, a frequency measuring unit for measuring each time the frequency of one of the voltage controlled oscillators, and a comparator for comparing the output signal of the frequency measuring unit with the corresponding digital channel indication signal and deriving a correction signal for the related voltage memory, whereby in a first circuit the buffer memories in the subscriber posts are scanned in a predetermined sequence and the read out new selection signals are stored into the selection signal memory, that in a second circuit which is in principle independent from said first mentioned circuit each time one of the selection signals is read out from the selection signal memory and is converted by means of a conversion memory into the digital channel indication signal which is used to adjust the related voltage memory through the digital to analogue converter, that in a third circuit in principle independent from said first and said second circuit the voltage controlled oscillators are scanned in a predetermined sequence and the frequencies thereof are measured by means of the frequency measuring unit, after which the value delivered by the frequency measuring unit is each time compared with the channel indication signal, corresponding to the related oscillator and supplied by the conversion memory, whereby a deviation between both results into a correction signal delivered to the voltage memory.

Because the scanning of the subscriber posts, the processing of the received selection signals and the eventual adjustment of the mixing stage oscillators takes place in separate circuits or control loops, each circuit can be adapted to the specific requirements valid for only that circuit.

In the first circuit all subscriber posts are scanned into a predetermined sequence and new selection signals of the subscriber posts are received and stored into the selection signals memory. Because in this circuit in principle no further functions are carried out it is possible to maintain the scanning period necessary for each subscriber station very small, so that a large number of subscribers can be connected to an exchange according to the invention, whereby each subscriber post, however, with an acceptable repetition frequency, for instance ten times per second, is scanned.

Because during the major part of the scannings no new selection signal will be received there is sufficient time to process the selection signals in the second circuit. Each selection signal is converted by means of the conversion memory into a digital channel indication signal which is thereafter used to control the related voltage memory. For this conversion and control process in principle more than sufficient time is available to detune the mixing stage oscillators correctly in one cycle.

Thereafter there is more than sufficient time to scan the mixing stage oscillators one by one in the intermediate periods, measure the frequency of these oscillators and compare the frequency with the channel indication signal for the related oscillator delivered by the conversion memory. This controlling and adjusting of the mixing stage oscillators can take place with a very low repetition frequency, for instance approximately one time per minute, because practice has proven that the possible drift of the oscillators in such a short time period will be so small that this drift will have no noticeable influence onto the signal received in the subscriber station.

In the third circuit each time the conversion memory has to be used to convert the selection signal corresponding to the mixing stage oscillator of which the frequency is checked, into a channel indication signal necessary for the comparison with the signal supplied by the frequency measuring unit. Although in general there is sufficient time available for this procedure it will be favourable according to a preferred embodiment of the invention that the system comprises a channel indication signal memory of which the input is connected to the output of the conversion memory, that in said second circuit the channel indication signals delivered by said conversion memory are stored in said channel indication signal memory and that in said third circuit each time the channel indication signal from said channel indication signal memory is used for the comparison instead of the channel indication signal delivered by said conversion memory.

The effect of the presence of this channel indication signal memory is that the conversion of the selection signal into the channel indication signal has to be carried out each time only once. Also for checking and eventually correcting a mixing stage oscillator, once the oscillator is tuned, this channel indication signal is directly available.

A preferred embodiment of the invention is characterized in that the selection means in the subscriber posts are able to generate time value signals in addition to the selection signals, that the selection signal memory comprises additional memory locations for storing one or more time values together with at least a part of the selection signals and comprises a time program memory in which combinations of time values and selection signals can be stored.

A preferred embodiment of the switching system according to the invention, which does not have to comprise a channel indication signal memory, is, for processing time values configurated such, that in said first circuit the presence of a time value with a selection signal is detected and said selection signal is not supplied to the selection signal memory but is instead thereof with the assigned time value supplied to the time program memory and that in a fourth circuit, in principle independent from said other circuits with regularly time intervals the time program memory is scanned and the time values, which are each time read out, are compared with the actual time and in case of agreement the selection signal corresponding to the time value concerned is transmitted to the selection signal memory.

If the switching system comprises a channel indication signal memory then the configuration can be such that in said second circuit each selection signal accompanied with a time value is converted in the corresponding channel indication signal by means of the conversion memory, which channel indication signal together with the accompanying time value is stored in the time program memory, and that in said fourth circuit said channel indication signal is transferred to the channel indication signal memory in case of agreement between the said read out time value and the actual time.

In this embodiment of the switching system it is possible to preprogram which channels have to be switched through at which time moments. Each subscriber post has for instance the ability to generate a predetermined restricted number of combinations of time values and selecting circuits to the exchange, with the result that on predetermined time periods predetermined programs are switched through to the subscriber post concerned. This possibility can for instance be used to receive a certain program in case of absence to registrate this program for instance onto a video recorder. It is furthermore possible for instance to choose beforehand out of the available children programs, so that the children are not able to watch programs which are for one reason or another not considered as suitable for them.

It is further possible that through the frequency multiplex line also communication signals (television signals) or data signals are supplied, which are not destined to be received by every arbitrary subscriber post. One can for instance think of courses only destined to a certain number of participants, programs only destined for police, fire brigades, doctors and other kinds of programs only destined for a separate user group. It is also possible to supply through said multiplex line communication or data signals for which the subscriber has to subscribe separately before he is allowed to receive these communication or data signals. A preferred embodiment of the switching system according to the invention, adapted to these possibilities, is now characterized in that the exchange comprises an admission memory in which for each of the subscriber posts the channels are registered the reception of which is admitted to the subscriber or not, and means are present permitting the switching through of a channel the reception of which is admitted for the subscriber concerned. The functioning of this configuration may be such that in the admittance memory the channel numbers of the admitted channels are registrated and that said means are embodied as a comparator comparing the selection signal received from a subscriber post with the admitted channels stored in the admittance memory, which comparator allows the storing of the selection signal in the selection signal memory in case of agreement.

It is also possible that said means are embodied as a comparator for comparing a selection signal which is received from a subscriber post and stored into the selection signal memory, with the admitted channels stored in the admittance memory, which comparator allows the conversion of the selection signal in said conversion memory and the storing of the resulting channel indication signal in said channel indication signal memory in case of agreement.

Such an admittance memory can play an important roll in a so called pay-television system, that means a television system in which one has to pay separately per program for at least a number of programs.

The configuration of a pay television system can for instance be such that for instance a short part, for instance an announcement of a certain program can be received by anyone. The subscriber who likes to receive this program has to generate a signal, for instance by means of his selector means, which is not a selection signal for a certain program, and this separate signal is now detected in the first circuit of the switching system and transmitted further to a processing unit. This processing unit registrates this signal to be able to charge the costs of the reception afterwards and processes this separate signal further such that in the admittance memory the channel, under which this program is transmitted, is indicated as "admitted".

To prevent that subscribers, which do not signify that they like to receive the program, are getting the related program signal supplied preferably means are present for, in case the contents of the admittance memory is changed, comparing the selection signals stored in the selection signal memory respectively the channel indication signals stored in the channel indication signal memory one by one with the new selection signals respectively channel indication signals stored in the admittance memory, and that in case of non-agreement an erase signal is generated to erase the selection signal concerned respectively the channel indication signal concerned out of the selection signal memory respectively the channel indication signal memory.

To prevent that a subscriber does not notice anything of his wrong choice if he is generating a selection signal for a not allowed channel, and thereafter still receives the program selected before, as in the known system, the functioning of a preferred embodiment of the system of the invention is such that in case a not admitted channel is selected by a subscriber the selection signal respectively channel indication signal of a separate service channel or information channel is stored into the channel frequency memory instead of the normal selection signal respectively the channel indication signal. The result thereof is that the subscriber, which has selected a not admitted channel, receives a special signal, for instance an information signal or an announcement signal, making the subscriber clear that he has selected a not admitted channel.

Preferably the switching system according to the invention comprises a subtractor, in which the comparison between the signal delivered by the frequency measuring unit and the channel indication signal is carried out by subtracting in the third circuit. If the subtractor detects a difference then preferably in the third circuit only a correction signal is supplied to the voltage memory in case the difference detected by the subtractor exceeds a predetermined threshold value. Thereby it is prevented that the subtractor supplies difference values which only differ in the least significant bit, in which case the above indicated unwanted modulation of the mixing stage oscillator signal could be obtained.

Because of several reasons, for instance the fact that the selecting means are embodied in the form of a keyboard, onto which after using the keys to generate a selection signal it is not clear anymore which signal was selected, it is preferable that in the second circuit a return signal is formed after reading a selection signal out of said selection signal memory, which return signal is stored into a return signal memory, and that in said first circuit simultaneously with the scanning of the subscriber posts also this return signal memory is scanned and a return signal destined for the scanned subscriber is transmitted to said subscriber post.

In a preferred embodiment of a switching system in which this return signal is used, the subscriber posts comprise indication means for indicating a channel number, which indication means are controlled by the return signal. The return signal may be an invariable signal which is not dependent onto the selecting channel. However, preferably the return signal is equal to the selection signal and the subscriber post comprises a comparator which in case of agreement between the return signal and the selection signal in the buffer register erases such buffer register and inputs a predetermined contents into this buffer register.

The fact that the indication means are making the selected channel number visible proves to the subscriber that the selection signal is correctly transmitted aand received by the exchange. If for one reason or another a disturbance appears in the selection means, the cable connection, the first or the second circuit, then this will directly become clear because in that case no correct return message is received by the subscriber.

Instead of the selection signal itself also a thereto related signal can be used as return signal.

In the above-mentioned known system the signals generated by the various mixing stage oscillators are supplied through a multiplexer to a fixed frequency divider, a so-called "prescaler". The advantage of this configuration seems to be the fact that only one multiplexer and only one prescaler are necessary. However, the more severed disadvantage is that one has to use a multiplexer capable of processing the high frequency program and data signals. It appears that in practice one has to encounter very big problems.

Within the scope of the invention therefore the switching system is preferably configurated such that the exchange comprises a number of fixed high frequency dividers, each coupled to one of the oscillators to divided the oscillator frequency of the corresponding oscillator by a fixed divider and the frequency measuring unit comprises a counter in which each time during a predetermined time period the output signal, received from said fixed high frequency divider is received as counting signal.

Although the distinction between a new selection signal and an unaltered selection signal can be made in the first or second circuit by comparing the received selection circuit with the selection circuit stored for the concerned subscriber, this implicates that each time one should have to access the selection signal memory to read the therein stored selection signal. A quicker functioning embodiment is realized after reading a selection signal out of the buffer memories in the subscriber posts a predetermined special code is registered therein and the means for distinguishing between a new selection signal and an unaltered selection signal are embodied as a detector delivering a signal for inhibiting the selection signal input in the selection signal memory when said special code is received from a subscriber post. This special code may for instance comprise a series of zeroes which can be detected very easily. Only when signals are received differing from zeroes then these signals are selection signals which have to be passed and can be stored in the selection signal memory.

To restrict the chance on difficulties when the same memory has to be accessed in different circuits, preferably the configuration is such, that sequential scanning of the oscillators together with the reading of the transformed selection signals out of the conversion memory respectively the channel indication signals out of the channel indication memory is interrupted each time when in said second circuit a new selection signal is processed.

To be able to change the data in the conversion memory in a simple way it is possible to embody this memory as a read only memory, which can be interchanged as component very easily. However, it is therefore necessary that someone transports this new read only memory to the exchange and interchanges the memories. To simplify this procesure preferably the conversion memory is embodied as a readwrite memory in which the data necessary for the conversion process can be changed through a separate control line when the frequency position of the communication or data signals onto the frequency multiplex conductor is changed.

Furthermore it is possible to use the selection means in the subscriber posts to generate separate signals which are not related to the program or data signal choice, of which above already an example was described, such signals may for instance relate to a burgler alarm, fire alarm, old people's alarm and similar systems. Also one can think of reaction signals in relation to enquiries, game programs, etc. According to a preferred embodiment the signals, generated in the subscriber post, which are and not related to the choice of the program or data signals entering the exchange through the multiplex line will be detected in the first circuit by means of a thereto present detector and are, eventually after a temporarily storage transmitted to further processing means.

BRIEF DESCRIPTION OF THE DRAWINGS

Further embodiments, characteristics and advantages of the invention wil become clear in the following description in which, referring to the attached drawings, preferred embodiments of the invention are described.

FIG. 2 illustrates schematically in the form of a block scheme a second embodiment of a system according to the invention.

DESCRIPTION OF THE PREFERRED EMBODIMENTS

Figure 1:
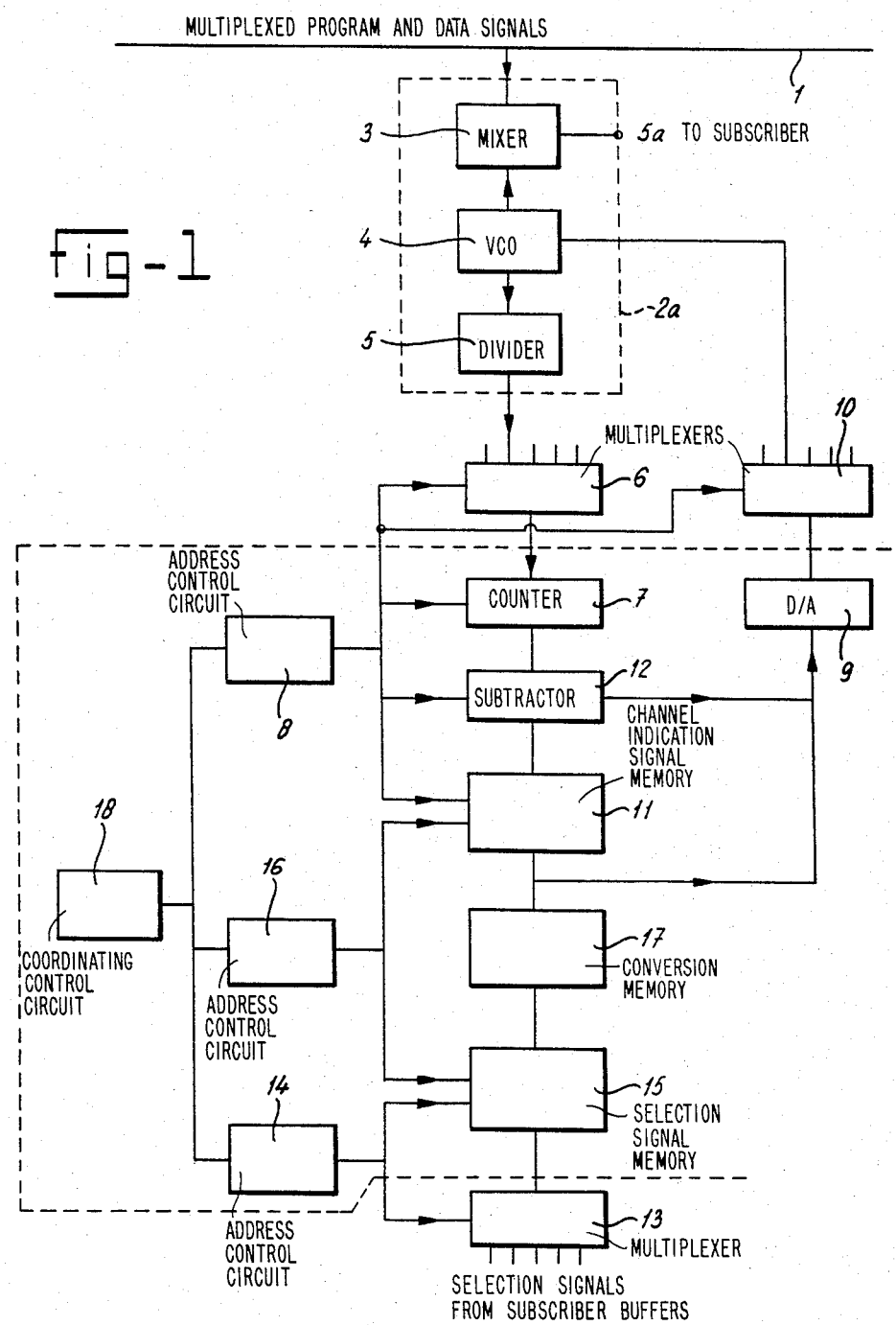
FIG. 1 illustrates schematically in the form of a block scheme a first embodiment of a system according to the invention.

FIG. 1 illustrates a system in which the invention is applicated. The available program- and data signals are input in the exchange through the multiplex line 1. For each of the subscriber posts connected to the exchange a subscriber circuit is present in the exchange, of which circuits only one, denoted with the reference number 2, is indicated in FIG. 1. This subscriber circuit comprises a mixing stage 3, of which the one input is connected to the frequency multiplex line 1 and of which the other input is connected to the voltage controlled oscillator 4. The output of the mixing stage is connected to the subscriber connection 5a. Dependent on the signal delivered by the variable voltage controlled oscillator 4 one of the program or data signals available on the frequency multiplex line 1 will by means of the mixing stage 3 be transferred to a frequency band, which is suitable for reception in the subscriber post and will be delivered through the subscriber terminal 5a through the subscriber concerned.

The voltage controlled oscillator 4 internally comprises a voltage memory, for instance in the form of a capacitor, which is not separately illustrated in the Figure. The output signal of the oscillator 4 is furthermore supplied to a dividing circuit 5 having a fixed divisor, by means of which the relatively high frequency of the oscillator 4 is decreased to a value which can be processed by relatively low frequency multiplexers.

As appears from FIG. 1 the output signal of this divider or preselector 5 is through the multiplexer 6 supplied to a counter 7, which under the control of the address/control circuit 8 each time during a predetermined time period counts the signal of the oscillator received through the divider 5 and the multiplexer 6. At the end of said time period the counter contents of the counter 7 will be compared in the subscriber 12 with a nominal channel indication signal value received from the channel indication signal memory 11 and an eventuaal difference formed in the subtractor 12 is by means of a digital to analogue converter 9 converted into a control signal that is supplied through the multiplexer 10 to the voltage controlled oscillator 4.

By means of the multiplexer 13 each of the subscriber posts connected to the exchange is scanned on the presence of selection signals. Preferably the subscriber posts are embodied such that each subscriber post comprises a buffer memory in which the selection signal generated in the related subscriber posts is temporarily stored until said subscriber post is scanned through the multiplexer 13 under the control of the address/control circuit 14. If this buffer memory is scanned then the selection signal stored therein will be transmitted to the exchange and after judging the admittance will be stored together with the subscriber number in the selection signal memory 15, which is addressed by the address/control circuit 14. This selection signal channel 15 preferably is of the queue-type, in which information is input at the one side in the order in which the information appears and from which information is read out and erased at the other side. The buffer memory in the now scanned subscriber post is preferably filled with a predetermined fixed code, for instance a combination of only zeroes. During the scanning the address/control circuit 14 therefore only has to check if this predetermined special code is received or not. Is this special code received, that means in the abovementioned example is a combination of only zeroes received, then the address/control circuit 14 steps through the multiplexer 13 directly further to the next subscriber post to scan the buffer memory therefrom. However, is a signal received which is not equal to this special predetermined combination then this signal is a selection signal and this selection signal is stored by the circuit 14 into the selection signal memory 15.

Because in a preferred embodiment of the invention the buffer memories in the subscriber posts are occupied by a special code after reading the therein stored selection signal, one attains the result that the circuit 14 is able to distinguish between a situation which has not altered after the last scanning and the appearing of a new selection signal. Only in the last mentioned situation the exchange in fact will have to take action.

In a next circuit, which in principle functions independently from the above-mentioned scanning circuit, each of the selection signals in the selection signal memory 15 will be read out in the sequence of entering into this buffer memory 15 under control of the address/control circuit 16 and converted through a conversion memory 17 into a channel indication signal, which is related to the frequency to which the concerned oscillator 4, assigned to the subscriber post from which said selection channel was received, has to be tuned. This channel indication signal is on the one hand supplied to the digital to analogue converter 9 which converts this digital channel frequency signal into an analogue oscillator control signal, that means a voltage with a certain amplitude, which voltage is through the multiplexer 10 supplied to the corresponding voltage controlled oscillator 4. Therefore the oscillator 4 will be tuned to that frequency, which because of the mixing procedure in the mixing stage 3 gives the result that the program corresponding to the selection signal is supplied from the multiplex line 1 to the subscriber terminal 5a. The voltage supplied to the oscillator 4 is furthermore stored into a voltage memory, assigned to the oscillator 4 but not separately indicated in FIG. 1, so that the oscillator 4 will in principle be maintained on this tuned frequency.

The channel indication signal received from the conversion memory 17 and used for tuning the related oscillator 4 is in the illustrated embodiment also supplied to a channel indication signal memory. The subscriber number which was stored together with selection signal in the selection signal memory 15 is now used by the address/control circuit 16 as address of that position in the channel indication memory 11 in which the channel indication signal should be stored.

The conversion memory is in principle a memory in which for each possible selection signal a corresponding channel frequency signal is stored. In principle one can embody this conversion memory as a read only memory (ROM), which is preprogrammed with suitable fixed channel frequency values, however, a read-write memory is preferred. In the last-mentioned case it is possible, when for one reason or another the frequency position of a channel onto the multiplex line 1 should be changed, to change also the conversion values in the conversion memory 17 through a separate control line from a central point such, that every subscriber after generating the same selection signal still receives the same frequency and therefore does not notice an eventual change of the channel positions on the multiplex line 1.

In the already described way in the third circuit under control of the addres/control circuit 8 each time the frequency of one of the oscillators 4 is measured through the multiplexer 6 and the counter 7 and the measured value is compared in the subtractor 12 with the nominal channel indication signal stored in the channel indication signal memory 11 or with the related selection signal after reading the signal from the memory and converting the signal in the conversion memory. If the subtractor 12 detects a difference, then this difference is in the digital to analogue converter 9 converted to a correction signal which is through the multiplexer 10 supplied to the voltage controlled oscillator 4.

Although in the above description a digital to analogue converter is used which is each time directly controlled it is also possible to insert an oscillator memory for this digital to analogue converter in which each time first of all a value is entered corresponding with the frequency in which the mixing stage oscillator is tuned. Thereafter an eventual difference is determined in the subtractor 12 (for detuning or correcting purposes) and on the basis thereof the contents of this oscillator memory is changed by adding or subtracting this difference value to respectively from the contents of the memory such that the mixing stage oscillator is detuned in the desired way to the resulting memory value.

If now for one reason or another the mixing stage oscillator does not reach its tuned situation, then with each check of this oscillator a difference value will be generated in the subtracter, which difference is then added to the value in the oscillator memory, so that very quickly a maximum (or minimum) value in the oscillator memory is reached and "overflow" of said memory will occur. This overflow can be detected and be used as warning signal, whereby also the not correct functioning mixing stage oscillator can be indicated.

It will be clear from the description above that in principle the first, second and third circuits under control of the respective address/control circuits 14, 16 and 18 are able to function independent from each other. However, as appears from the Figure, said various address/control circuits have common access to a number of memories. The selection memory 15 is for instance used by the control circuit 14 for writing selection signals and is also used by the control circuit 16 for reading selection signals. The channel indication signal memory 11, if present, is addressed by the control circuit 16 for storing channel indication signals received from the conversion memory 17. This channel indication signal memory 11, however, is also addressed by the control circuit 8 to read channel indication signals therefrom and to supply these signals to the subtractor 12. It may therefore be necessary to use a coordinating control circuit 18, coupled to each of the control circuits 14, 16 and 8 to take care that each of the memories concerned is only accessed by one control circuit at a time.

From the description above it will be clear that the control circuit 14 functions cyclically by cyclically scanning continuously the subscriber posts through the multiplexer 13.

If there is no channel indication signal memory then each time the selection signal memory should be accessed instead of this channel indication signal memory and in that case of course the control circuits have to be adapted.

The control circuit 16 in fact only has to come into action when selection signals are present in the selection memory 15 which signals through the conversion memory 17 have to be converted into a channel indication signal and have to be stored in the eventually present channel indication signal memory.

The selection memory 15 can for instance comprise a counter for keeping count of the number of data inputted in the selection memory and the number of data read from this memory. As long as the counter has a positive content then there are selection signals in the selection memory to be processed and for so long the control circuit 16 should be kept active. However, reaches this counter the zero content then there is no signal present anymore in the selection memory and the control circuit 16 can be brought in the standby position. Keeping count of the selection signals can, however, be done also in various other ways, dependent on the embodiment of the selection memory and the way it is controlled.

As the control circuit 14 also the control circuit 8 functions cyclically, although in this case it uses a much longer cyclical period.

FIG. 2 illustrates a further development of the circuit shown in FIG. 1, whereby the components which are in FIG. 1 indicated by the reference numbers 7, 12, 8, 14, 16, 18 are combined into one common control circuit 20, which for instance could be implemented by means of a suitably programmed microprocessor. The memories 11, 15 and 17 are in FIG. 2 indicated separately, coupled to the central processor 20. The functioning of this system is furthermore equal to the functioning of the system illustrated in FIG. 1.

In FIG. 2 two further memories are indicated, namely the time value memory 19 and the admittance memory 21. The admittance memory 21 can be used to determine if a subscriber is allowed to receive a channel which he has selected. Through the frequency multiplex line 1 for instance communication or data signals can be transmitted which are not destined for all subscribers and only may be received by a predetermined restricted group of subscribers. One can thereby think of signals destined for the fire brigade, police, hospitals, etc. Furthermore one can think of television channels for which one has to subscribe separately before one is allowed to receive these channels. In the admittance memory 21 now for each subscriber data are stored indicating those channels the reception of which is allowed to the related subscriber or not. In this admittance memory for instance selection signals can be stored corresponding to those channels for which the subscriber has reception allowance. The central processor 20 can be embodied such that not only the multiplexer 13 is stepping cyclically, but also this admittance memory is simultaneously cyclically addressed such that for each scanned subscriber post at the output of said admittance memory the channel numbers for which the second subscriber post has reception admittance are available. In this way it is possible for each received selection signal to check by means of comparison if said generated selection signal corresponds to an allowed channel.

if said comparison would take too much time, then it is also possible to store in the admittance memory for each subscriber channel indication values for those channels, for which the related subscriber has no reception admittance. Then in the second circuit after conversion of the selection signal into a channel indication signal but before the use of this selection signal for control of the assigned oscillator and also before the eventual storing of this channel indication signal in the channel indication signal memory by means of comparison it is checked if the concerned channel indication signal belongs to the allowed channel indication signals or not. If a not allowed channel indication signal appears, then this channel indication signal is not used to control the oscillator and it is furthermore not stored in an eventually present channel indication signal memory.

Regardless the configuration preferably a signal is generated when the comparison from either the selection signals or the channel indication signals indicates that one has selected a channel for which the concerned subscriber has no reception allowance. This signal can be used to store a selection signal into the selection signal memory corresponding with an information channel or service channel with the result that the subscriber which has selected this not allowed channel, receives for instance a message indicating his eroneous choice or he receives in another way an indication that he has selected a wrong channel. This has the advantage that in each case another selection signal is stored in the selection signal memory, so that the program which was originally transmitted to the concerned subscriber is ended, which itself forms an indication for that subscriber that his selection signal is received in the exchange.

In switching systems in which the subscriber posts are comprising selector means for generating selection signals and time values it is possible to program a number of communication or data channels which have to be received in future. The first circuit may for instance comprise a detector detecting the presence of time values, whereby the central processor 20 will be activated to store the selection signals received together with these time values not in the selection signal memory but together with the concerned subscriber number into the time value memory 19. It is now possible to test in a separate circuit with regularly intervals, for instance one time per minute, or if this is not allowable with greater intervals, if the time value of the selection signals stored in the time value memory equals the momentaneous time (taking into account a certain tolerance at both sides). In case of agreement the selection signals belonging to the time value(s) and the subscriber numbers are transmitted to the selection signal memory and are processed in the already described way. The result thereof is that a subscriber has the possibility to combine a program in advance, whereafter automatically at the indicated moments the desired communication or data signals are transmitted. This possibility for instance can be used to program a television set at the absence of the parents such, that children can receive only programs which are indicated by the parents in advance. Also this possibility can be used to registrate a favourite television transmission onto a video recorder in case of absence.

In the subscriber posts indication means can be present for indicating the channel number of a communication or data signal which is momentaneously transmitted to the subscriber. Preferably these indication means is activated by a return signal generated in the exchange. This return signal can be identical to the selection signal in case the subscriber post has decoding means for converting the selection signal into such a control signal, that the indication means are indicating the correct channel number under control of said signal. This has the advantage that the subscriber is informed by the exchange about the number of the momentaneously received channel. Especially in systems in which a large number of channels are available for reception such a return message might be useful.

Furthermore it is in many cases possible to use the selection means not only for generating selection signals, but also for generating signals which are for instance related to a fire alarm circuit, an aged people's alarm circuit, a burglar alarm circuit and similar circuits, or signals which are related to an inquiry, a play game, etc. These signals which are not related to the choice of a program are detected as such in the first circuit and as a result threof these signals are not stored in the selection signal memory but transmitted to a separate processing unit. If the signals are in this unit recognized as alarm signals, then on the basis of the suitable measurements will be taken, for instance an alarm is sent out to the police or to the fire brigade. If the signals are for instance related to a game program, in which subscribers by means of keying in a predetermined code can return an answer back, then this answering signal will be processed in the processing unit, converted there and transmitted for instance back to the television studio.

It will be clear that within the scope of the invention several variants and changes of the illustrated and discussed embodiments are possible.

I claim:

1. Switching system comprising an exchange and a number of subscriber posts connected to said exchange through a cable network, whereby each subscriber post comprises selector means for generating selection signals for selecting one out of a number of program or data signals accomodated into channels received in the exchange over a multiplex line, and said exchange furthermore comprises for each subscriber post a mixing stage and a corresponding voltage controlled oscillator with a voltage memory, and furthermore comprises means for scanning the selection signals of the subscriber posts by means of a multiplexer, means for deriving a frequency signal, related to the nominal oscillator frequency, out of each selection signal, means for deriving a signal from the oscillator assigned to the corresponding subscribing post through a multiplexer and means for comparing said derived oscillator signal with said frequency signal related to the nominal oscillator frequency to generate a control signal for the voltage memory assigned to the measured oscillator which control signal is delivered thereto through a multiplexer for adjusting the oscillator such, that the program- or data signals chosen by means of the selection signals are transmitted from the exchange through the mixing stage and the cable network to the corresponding subscriber, characterized in that each of the subscriber posts comprises a buffer memory for storing selection signals and the exchange comprises means for distinguishing a new selection signal from an unaltered selection signal, a selection signal memory in which the new selection signals received from the buffer memories in the subscriber posts are stored, a conversion memory for deriving a digital channel indication signal out of a selection signal from the selection signal memory, a digital to analogue converter for converting said digital channel indication signal into a control signal for the related voltage memory, a frequency measuring unit for measuring each time the frequency of one of the voltage controlled oscillators, and a comparator for comparing the output signal of the frequency measuring unit with the corresponding digital channel indication signal and deriving a correction signal for the related voltage memory,
   whereby in a first circuit the buffer memories in the subscriber posts are scanned in a predetermined sequence and the read out new selection signals are stored into the selection signal memory,
   that in a second circuit which is in principle independent from said first mentioned circuit each time one of the selection signals is read out from the selection signal memory and is converted by means of a conversion memory into the digital channel indication signal which is used to adjust the related voltage memory through the digital to analogue converter,
   that in a third circuit in principle independent from said first and said second circuit the voltage controlled oscillators are scanned in a predetermined sequence and the frequencies thereof are measured by means of the frequency measuring unit, after which the value delivered by the frequency measuring unit is each time compared with the channel indication signal, corresponding to the related oscillator and supplied by the conversion memory, whereby a deviation between both results into a correction signal delivered to the voltage memory.

2. Switching system according to claim 1, characterized in that the system comprises a channel indication signal memory of which the input is connected to the output of the conversion memory, that in said second circuit the channel indication signals delivered by said conversion memory are stored in said channel indication signal memory and that in said third circuit each time the channel indication signal from said channel indication signal memory is used for the comparison instead of the channel indication signal delivered by said conversion memory.

3. Switching system according to claim 1 or 2, characterized in that the selection means in the subscriber posts are able to generate time value signals in addition to the selection signals, that the selection signal memory comprises additional memory locations for storing one or more time values together with at least a part of the selection signals and comprises a time program memory in which combinations of time values and selected signals can be stored.

4. Switching system according to claim 3, characterized in that in said first circuit the presence of a time value with a selection signal is detected and said selection signal is not supplied to the selection signal memory but is instead thereof with the assigned time value supplied to the time program memory and that in a fourth circuit, in principle independent from said other circuits with regularly time intervals the time program memory is scanned and the time values, which are each time read out, are compared with the actual time and in case of agreement the selection signal corresponding to the time value concerned is transmitted to the selection signal memory.

5. Switching system according to claim 3, characterized in that in said second second circuit each selection signal accompanied with a time value is converted in the corresponding channel indication signal by means of the conversion memory, which channel indication signal together with the accompanying time value is stored in the time program memory, and that in said fourth circuit said channel indication signal is transferred to the channel indication signal memory in case of agreement between the said read out time value and the actual time.

6. Switching system according to claim 1 or 2, characterized in that the exchange comprises an admission memory in which for each of the subscriber posts the channels are registered the reception of which is admitted to the subscriber or not, and means are present permitting the switching through of a channel the reception of which is allowed for the subscriber concerned.

7. Switching system according to claim 6 characterized in that said means are embodied as a comparator comparing the selection signal received from a subscriber post with the admitted channels stored in the admittance memory, which comparator allows the storing of the selection signal in the selection signal memory in case of agreement.

8. Switching system according to claim 6, characterized in that said means are embodied by a comparator for comparing a selection signal which is received from a subscriber post and stored into the selection signal memory, with the admitted channels stored in the admittance memory, which comparator allows the conversion of the selection signal in said conversion memory and the storing of the resulting channel indication signal in said channel indication signal memory in case of agreement.

9. Switching system according to claims 6, characterized in that means are present for, in case the contents of the admittance memory is changed, comparing the selection signals stored in the selection signal memory respectively the channel indication signals stored in the channel indication signal memory one by one with the new selection signals respectively channel indication signals stored in the admittance memory, and that in case of non-agreement an erase signal is generated to erase the selection signal concerned respectively the channel indication signal concerned out of the selection signal memory respectively the channel indication signal memory.

10. Switching system according to claims 9, characterized in that in case a not admitted channel is selected by a subscriber the selection signals respectively channel indication signal of a separate service channel or information channel is stored into the channel frequency memory instead of the normal selection signal respectively the channel indication signal.

11. Switching system according to claim 1, characterized in that a subtractor is present in which the comparison between the signal delivered by the frequency measuring unit and the channel indication signal in the third circuit is carried out by subtraction.

12. Switching system according to claim 11, characterized in that in said third circuit a correction signal is supplied to the voltage memory concerned only in case the subtractor detects a difference exceeding a predetermined threshold value.

13. Switching system according to claim 1, characterized in that in said second circuit a return signal is formed after reading a selection signal out of said selection signal memory, which return signal is stored into a return signal memory, and that in said first circuit simultaneously with the scanning of the subscriber posts also this return signal memory is scanned and a return signal destined for the scanned subscriber is transmitted to said subscriber post.

14. Switching system according to claim 13, characterized in that the subscriber posts comprise indication means for indicating a channel number, which indication means are controlled by said return signal.

15. Switching system according to claim 12, characterized in that said return signal equals the selection signal and the subscriber post comprises a comparator which, in case of agreement between said return signal and the selection signal in the buffer register erases said buffer register and inputs a predetermined contents into said buffer register.

16. Switching system according to claim 14, characterized in that a signal which is in fact related to the selection signal stored into said selection signal memory is used as return signal.

17. Switching system according to claim 1, characterized in that the exchange comprises a number of fixed high frequency dividers, each coupled to one of the oscillators to divide the oscillator frequency of the corresponding oscillator by a fixed divisor and the frequency measuring unit comprises a counter in which each time during a predetermined time period the output signal, received from said fixed high frequency divider is received as counting signal.

18. Switching system according to one claim 1, characterized in that after reading a selection signal out of the buffer memories in the subscriber posts a predetermined special code is registered therein and the means for distinguishing between a new selection signal and an unltered selection signal are embodied as a detector delivering a signal for inhibiting the selection signal input in the selection signal memory when said special code is received from a subscriber post.

19. Switching system according to claim 1, characterized in that the sequential scanning of the oscillators together with the reading of the transformer selection signals out of the conversion memory respectively the channel indication signals out of the channel indication memory is interrupted each time when in said second circuit a new selection signal is processed.

20. Switching system according to claim 1, characterized in that the conversion memory is embodied as a readwrite memory in which the data necessary for the conversion process can be changed through a separate control line when the frequency position of the communication or data signals onto the frequency multiplex line is changed.

21. Switching system according to claim 6, characterized in that the admittance memory is embodied as a readwrite memory in which the necessary data can be changed through a separate control line when the admitted channels are changed.

22. Switching system according to claim 1, characterized in that signals generated in the subscriber post which are not related to the choise of one of the program or data signals received onto said multiplex line are detected as such by a therefor present detector and are, eventually after temporarily storage, transferred to further processing means.

23. Switching system according to claim 1, characterized in that an oscillator memory is inserted before the digital to analogue converter, in which oscillator memory in the third circuit each time first of all a control value is inputted respectively stored and that, in case of non-agreement between the nominal oscillator frequency and the measured oscillator frequency a difference control value corresponding to the detected difference is generated and added to the control value already present in said oscillator memory.

24. Switching system according to claim 23, characterized in that a warning signal is generated in case the control value in said oscillator memory is exceeding a predetermined minimum or maximum value.

* * * * *